United States Patent
Ryu et al.

(10) Patent No.: US 8,501,611 B2
(45) Date of Patent: Aug. 6, 2013

(54) METHODS OF FORMING INTEGRATED CIRCUIT DEVICES HAVING ELECTRICALLY CONDUCTIVE LAYERS THEREIN WITH PARTIALLY NITRIDATED SIDEWALLS

(75) Inventors: Jeong-Do Ryu, Seoul (KR); Si-Young Choi, Gyeonggi-do (KR); Yu-Gyun Shin, Gyeonggi-do (KR); Tai-Su Park, Gyeonggi-do (KR); Dong-Chan Kim, Gyeonggi-do (KR); Jong-Ryeol Yoo, Gyeonggi-do (KR); Seong-Hoon Jeong, Gyeongsangnam-do (KR); Jong-Hoon Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/551,251

(22) Filed: Jul. 17, 2012

(65) Prior Publication Data

US 2012/0282769 A1    Nov. 8, 2012

Related U.S. Application Data

(62) Division of application No. 12/536,865, filed on Aug. 6, 2009, now Pat. No. 8,252,681.

(30) Foreign Application Priority Data

Aug. 7, 2008   (KR) .................................. 2008-77531

(51) Int. Cl.
   *H01L 21/3205*    (2006.01)

(52) U.S. Cl.
   USPC .................. 438/596; 257/192; 257/E21.215; 438/696; 216/46

(58) Field of Classification Search
   USPC ................. 438/142–157, 197, 199, 200, 584, 438/590, 591, 598, 599, 627, 642, 643, 652, 438/653, 654, 657, 658, 689, 694, 735, 736; 257/192, 213, 288, E21.47
   See application file for complete search history.

(56) References Cited

U.S. PATENT DOCUMENTS

| 6,075,274 A | 6/2000 | Wu et al. |
| 2009/0209072 A1* | 8/2009 | Keller .......................... 438/253 |

FOREIGN PATENT DOCUMENTS

| KR | 1020020045260 A | 6/2002 |
| KR | 1020040001887 A | 1/2004 |

* cited by examiner

*Primary Examiner* — Julio J Maldonado
*Assistant Examiner* — Sonya D McCall Shepard
(74) *Attorney, Agent, or Firm* — Myers Bigel Sibley & Sajovec, P.A.

(57) ABSTRACT

Methods of forming integrated circuit devices include forming an electrically conductive layer containing silicon on a substrate and forming a mask pattern on the electrically conductive layer. The electrically conductive layer is selectively etched to define a first sidewall thereon, using the mask pattern as an etching mask. The first sidewall of the electrically conductive layer may be exposed to a nitrogen plasma to thereby form a first silicon nitride layer on the first sidewall. The electrically conductive layer is then selectively etched again to expose a second sidewall thereon that is free of the first silicon nitride layer. The mask pattern may be used again as an etching mask during this second step of selectively etching the electrically conductive layer.

12 Claims, 12 Drawing Sheets

METHODS OF FORMING INTEGRATED CIRCUIT DEVICES HAVING ELECTRICALLY CONDUCTIVE LAYERS THEREIN WITH PARTIALLY NITRIDATED SIDEWALLS

REFERENCE TO PRIORITY APPLICATIONS

This application is a divisional of U.S. patent application Ser. No. 12/536,865, filed Aug. 6, 2009, now U.S. Pat. No. 8,252,681 which claims priority to Korean Patent Application No. 2008-77531, filed Aug. 7, 2008, the disclosures of which are hereby incorporated herein by reference.

FIELD

The present invention relates to methods of forming integrated circuit devices and devices formed thereby and, more particularly, to methods of forming integrated circuit devices having gate electrodes therein and devices formed thereby.

BACKGROUND

Example embodiments relate to a semiconductor device and a method of manufacturing a semiconductor device. More particularly, example embodiments relate to a semiconductor device including an electrode structure and a method of manufacturing a semiconductor device having an electrode structure.

A semiconductor memory device usually includes a transistor such as a metal oxide semiconductor (MOS) transistor for a switching element. The transistor in a semiconductor memory device includes a gate electrode having a relatively low resistance and a proper work function in accordance with the electrical characteristics of the transistor.

As for a conventional semiconductor memory device, a gate electrode of a transistor generally includes polysilicon having a work function adjusted by impurities doped therein. Further, the gate electrode may include a metal layer to reduce a resistance thereof. However, the impurities in the gate electrode may be diffused in successive processes for manufacturing the conventional semiconductor memory device, so that the transistor may not ensure desired threshold voltage and electrical characteristics. Additionally, the metal layer in the gate electrode may cause the contamination of other elements in the semiconductor device in subsequent heat treatment process and/or a wet etching process.

SUMMARY

Methods of forming integrated circuit devices according to some embodiments of the invention include forming an electrically conductive layer containing silicon on a substrate and forming a mask pattern on the electrically conductive layer. The electrically conductive layer is selectively etched to define a first sidewall thereon, using the mask pattern as an etching mask. The first sidewall of the electrically conductive layer may be exposed to a nitrogen plasma to thereby form a first silicon nitride layer on the first sidewall. The electrically conductive layer is then selectively etched again to expose a second sidewall thereon that is free of the first silicon nitride layer. The mask pattern may be used again as an etching mask during this second step of selectively etching the electrically conductive layer.

In some of these embodiments of the invention, the electrically conductive layer is a polysilicon layer and the mask pattern is formed as a silicon nitride layer or a silicon oxynitride layer. This step of forming the electrically conductive layer may be preceded by a step of forming a gate insulating layer on the substrate. Moreover, the step of selectively etching the electrically conductive layer to expose a second sidewall thereon includes selectively etching the electrically conductive layer to define a gate electrode on the gate insulating layer.

According to additional embodiments of the invention, the step of exposing the first sidewall of the electrically conductive layer to a nitrogen plasma includes forming a silicon nitride surface layer on an etched-back upper surface of the electrically conductive layer. Accordingly, the step of selectively etching the electrically conductive layer to expose a second sidewall thereon may include anisotropically etching the silicon nitride surface layer and the electrically conductive layer in sequence. The step of exposing the first sidewall of the electrically conductive layer to a nitrogen plasma may also include exposing the first sidewall of the electrically conductive layer to a nitrogen plasma to thereby form a first silicon nitride layer having a thickness in a range from about 5 to about 30 on the first sidewall.

According to still further embodiments of the invention, the electrically conductive layer is formed as a composite of a polysilicon layer and at least one metal-containing layer on the polysilicon layer. In these embodiments of the invention, the step of exposing the first sidewall of the electrically conductive layer to a nitrogen plasma includes exposing a sidewall of the metal-containing layer to the nitrogen plasma.

BRIEF DESCRIPTION OF THE DRAWINGS

Example embodiments can be understood in more detail from the following description taken in conjunction with the accompanying drawings, in which.

DESCRIPTION OF EMBODIMENTS

Figure 1:
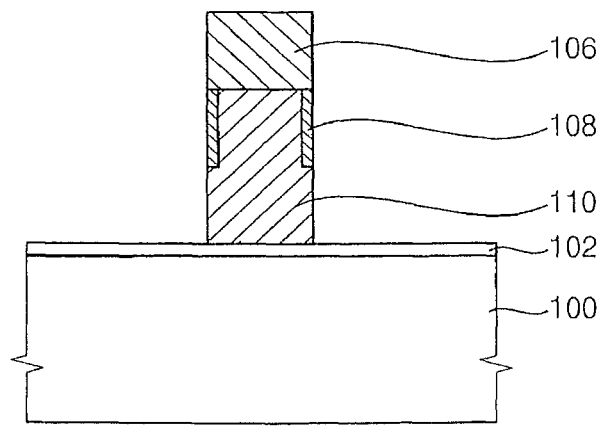
FIG. 1 is a cross sectional view illustrating an electrode structure in a semiconductor device according to example embodiments.

Example embodiments are described more fully hereinafter with reference to the accompanying drawings. The invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures) of the invention. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view illustrating an electrode structure in a semiconductor device according to example embodiments. The electrode structure illustrated in FIG. 1 may be used as a gate electrode in a metal oxide semiconductor (MOS) transistor. Alternatively, the electrode structure may be employed as a conductive structure in another semiconductor device, for example, a dynamic random access memory (DRAM) device, a static random access memory (SRAM) device, a phase change random access memory (PRAM) device, a flash memory device, etc.

Referring to FIG. 1, the electrode structure is provided on a substrate 100. The substrate 100 may include a semiconductor substrate such as a silicon (Si) substrate, a germanium (Ge) substrate, a silicon-germanium (Si—Ge) substrate, etc. Alternatively, the substrate 100 may include a substrate having a semiconductor layer such as a silicon-on-insulator (SOI) substrate, a germanium-on-insulator (GOI) substrate, a metal oxide substrate having a semiconductor layer thereon, etc.

The electrode structure includes an insulation layer 102, a conductive layer pattern 110, a diffusion barrier layer 108 and a mask 106. Alternatively, the electrode structure may include the insulation layer 102, the conductive layer pattern 110 and the diffusion barrier layer 108 without the mask 106.

The insulation layer 102 locates on the substrate 100. The insulation layer 102 may include oxide and/or metal oxide. For example, the insulation layer 102 may include silicon oxide (SiOx), hafnium oxide (HfOx), zirconium oxide (ZrOx), aluminum oxide (AlOx), tantalum oxide (TaOx), etc. These may be used along or in a mixture thereof.

In example embodiments, the insulation layer 102 may serve as a gate insulation layer when the electrode structure is used as the gate electrode of the transistor. Alternatively, the insulation layer 102 may function as a tunnel insulation layer when the electrode structure is employed in a nonvolatile semiconductor device such as the flash memory device.

The conductive layer pattern 110 is disposed on the insulation layer 102. In example embodiments, the conductive layer pattern 110 may include polysilicon doped with impurities. The conductive layer pattern 110 may include P type impurities or N type impurities in accordance with a conductive type of the transistor. For example, when the transistor has an N type conductivity, the conductive layer pattern 110 may include polysilicon doped with the N type impurities such as phosphor (P), arsenic (As), etc. Alternatively, when the transistor has a P type conductivity, the conductive layer pattern 110 may include the P type impurities boron (B), gallium (Ga), indium (In), etc.

In some example embodiments, the conductive layer pattern 110 may further include metal and/or metal compound. For example, the conductive layer pattern 110 may further include tungsten (W), titanium (Ti), tantalum (Ta), aluminum (Al), tungsten nitride (WNx), nickel (Ni), tungsten silicide (WSix), titanium nitride (TiNx), titanium silicide (TiSix), tantalum nitride (TaNx), aluminum nitride (AlNx), cobalt silicide (CoSix), nickel silicide (NiSix), etc. These may be used alone or in a mixture thereof.

In some example embodiments, the conductive layer pattern 110 may have a polyside structure that includes a polysilicon film and a metal silicide film. Here, the metal silicide film may include tungsten silicide, titanium silicide, cobalt silicide, nickel silicide (NiSix), etc. These may be used alone or in a mixture thereof.

The mask 106 is positioned on the conductive layer pattern 110. The mask 106 may include a material that has an etching selectivity relative to the conductive layer pattern 110 and/or the insulation layer 102. For example, the mask 106 may include nitride such as silicon nitride, or oxynitride like silicon oxynitride.

The diffusion barrier layer 108 is positioned on a sidewall of the conductive layer pattern 110. The diffusion barrier layer 108 may be generated from the conductive layer pattern 110. For example, the diffusion barrier layer 108 may be grown from the conductive layer pattern 110 by performing a nitrogen plasma treatment process about the conductive layer pattern 110. When the conductive layer pattern 110 includes polysilicon, the diffusion barrier layer 108 may include silicon nitride generated by the nitrogen plasma treatment process. Thus, the diffusion barrier layer 108 may be formed on the sidewall of the conductive layer pattern 110. In case that the diffusion barrier layer 108 includes silicon nitride generated from the conductive layer pattern 110, the diffusion barrier layer 108 may have a dense structure more that a normal silicon nitride layer obtained by a chemical vapor deposition (CVD) process or an atomic layer deposition (ALD) process. Further, an undesired interface may not be generated between the conductive layer pattern 110 and the diffusion barrier layer 108 when the diffusion barrier layer 108 is obtained by treating the conductive layer pattern 110 with the nitrogen plasma.

In example embodiments, the diffusion barrier layer 108 may prevent impurities or ingredients in the conductive layer pattern 110 from diffusing toward the insulation layer 102, the substrate 100 and/or upper conductive structures in successive processes. The diffusion barrier layer 108 may be disposed on a portion of the sidewall of the conductive layer pattern 110. For example, the diffusion barrier layer 108 may be positioned an upper sidewall of the conductive layer pattern 110 as illustrated in FIG. 1. Alternatively, the diffusion barrier layer 108 may be positioned on a substantially entire sidewall of the conductive layer pattern 110.

When a nitride layer is formed on a sidewall of a gate electrode by a CVD process or an ALD process, the nitride layer may have a relatively thick thickness above about 30 Å to prevent impurities or ingredients in the gate electrode from diffusing into a substrate and/or upper conductive structures. However, a distance between adjacent gate electrodes may be reduced by above about 60 Å when the nitride layer has the thick thickness above about 30 Å. In case that the distance between adjacent gate electrodes is decreased, a spacer may not be easily formed on a sidewall of the gate electrode, and also a contact or a pad may not be properly formed a contact region of the substrate between adjacent gate electrodes.

According to example embodiments, the diffusion barrier layer 108 may have a relatively thin thickness. For example, the diffusion barrier layer 108 may have a thickness in a range of about 5 Å to about 30 Å. Although the diffusion barrier layer 108 has this thin thickness, the diffusion barrier layer 108 may effectively prevent the impurities or ingredients in the conductive layer pattern 110 from diffusing into the insulation layer 102, the substrate 100 and/or the upper conductive structures because the diffusion barrier layer 108 has a dense structure in the plasma nitration process. The diffusion barrier layer 108 may be obtained from the conductive layer pattern 110, so that adjacent electrode structures on the substrate 100 may be separated by a desired distance. That is, a distance between adjacent electrode structures may not be reduced by the formation of the diffusion barrier layer 108.

In some example embodiments, the electrode structure may be suitable for a gate electrode including polysilicon doped with the P type impurities. The P type impurities may be rapidly diffused to the insulation layer 102, the substrate 100 and/or the upper conductive structures in a relatively high temperature process. Further, the P type impurities may be diffused in a direction substantially parallel relative to the substrate 100 in successive processes, thereby deteriorating a threshold voltage of the transistor. The transistor may have poor electrical characteristics when the threshold voltage of the transistor varies. According to some example embodiments, the diffusion of the P type impurities may be efficiently prevented because of the diffusion barrier layer 108 positioned on at least the upper sidewall of the conductive layer pattern 110. Accordingly, the transistor may ensure desired electrical characteristics without deteriorating a threshold voltage of the transistor.

FIGS. 2 to 6 are cross sectional views illustrating a method of manufacturing an electrode structure in a semiconductor device according to example embodiments.

Figure 2:
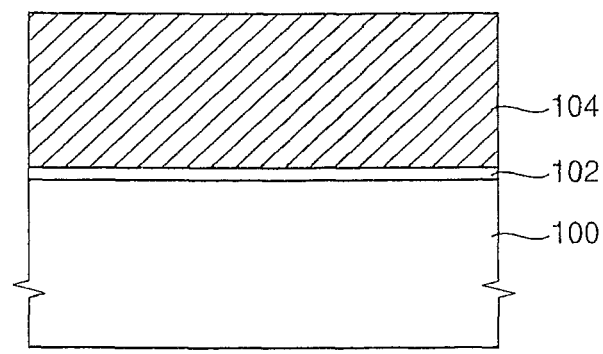
FIGS. 2 to 6 are cross sectional views illustrating a method of manufacturing an electrode structure in a semiconductor device according to example embodiments.

Referring to FIG. 2, an insulation layer 102 is formed on a substrate 100. The insulation layer 102 may be obtained by a thermal oxidation process, a CVD process, a high density plasma-chemical vapor deposition process, etc. Further, the insulation layer 102 may be formed using oxide and/or metal oxide. For example, the insulation layer 102 may be formed using silicon oxide, hafnium oxide, zirconium oxide, aluminum oxide, tantalum oxide, etc. These may be used alone or in a mixture thereof.

A conductive layer 104 is formed on the insulation layer 102. The conductive layer 104 may have a thickness substantially larger than that of the insulation layer 102. The conductive layer 104 may be formed using polysilicon doped with impurities. Further, the conductive layer 104 may include metal and/or metal compound. For example, the conductive layer 104 may include doped polysilicon, tungsten, titanium, tantalum, aluminum, tungsten nitride, nickel, tungsten silicide, titanium nitride, titanium silicide, tantalum nitride, aluminum nitride, cobalt silicide, nickel silicide, etc. The conductive layer 104 may be obtained by a sputtering process, a CVD process, a plasma enhanced chemical vapor deposition (PECVD) process, a low pressure chemical vapor deposition (LPCVD) process, etc.

In example embodiments, the impurities may be doped into a polysilicon layer while forming the polysilicon layer on the insulation layer 102, so that the conductive layer 104 including doped polysilicon may be provided on the insulation layer 102. That is, the impurities may be doped into the conductive layer 104 by an in-situ doping process. Alternatively, the impurities may be doped into the polysilicon layer after forming the polysilicon layer on the insulation layer 102.

The impurities in the conductive layer 104 may include N type impurities or P type impurities. When an N type MOS transistor is provided on the substrate 100, the impurities may include the N type impurities. However, the impurities may include the P type impurities when a P type MOS transistor is required on the substrate 100.

Figure 3:
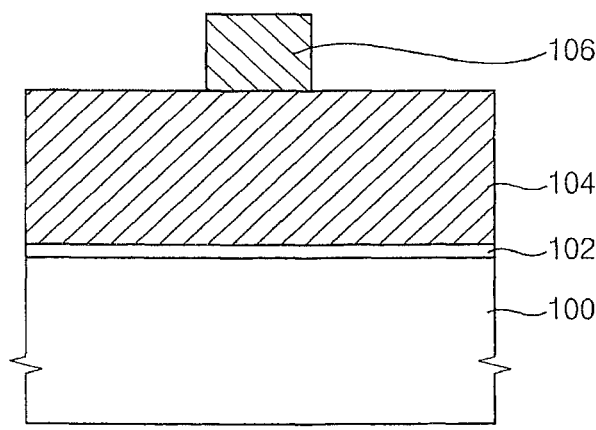

Referring to FIG. 3, a mask 106 is formed on the conductive layer 104. The mask 106 may be formed using a material that has an etching selectivity with respect to the conductive layer 104. For example, the mask 106 may be formed using silicon nitride or silicon oxynitride. The mask 106 may have a width substantially the same as or substantially similar to that of an electrode structure.

In example embodiments, a mask formation layer may be formed on the conductive layer 104, and then the mask formation layer may be etched by a photolithography process to provide the mask 106 on the conductive layer 104. The mask formation layer may be formed by a CVD process, a PECVD process, etc.

Figure 4:
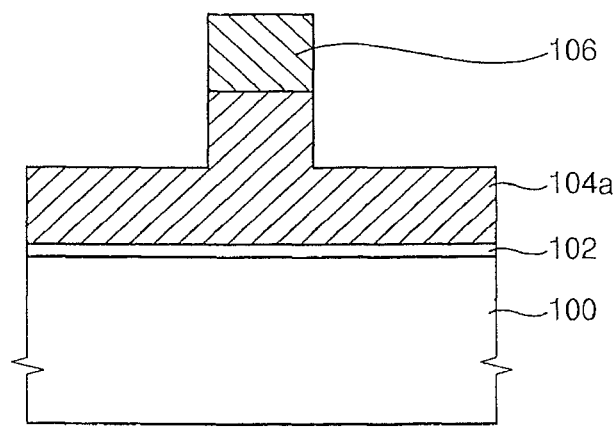

Referring to FIG. 4, the conductive layer 104 is partially etched using the mask 106 as an etching mask, such that a preliminary conductive layer pattern 104a is formed on the insulation layer 102. For example, a peripheral portion of the conductive layer 104 adjacent to the mask 106 may be partially etched whereas a central portion of the conductive layer 104 may not be etched due to the mask 106. Thus, the preliminary conductive layer pattern 104a may have a central portion substantially thicker than a peripheral portion thereof. The central portion of the preliminary conductive layer pattern 104a may be located beneath the mask.

In the formation of the preliminary conductive layer pattern 104a, an area of a sidewall of the preliminary conductive layer pattern 104a may increase when an etched depth of the conductive layer 104 increases. In case that the preliminary conductive layer pattern 104a has an enlarged sidewall, a diffusion barrier layer 108 (see FIG. 6) may also have an increased area. Therefore, the area of the diffusion barrier layer 108 may be desirably adjusted in accordance with an etched amount of the conductive layer 104.

When the peripheral portion of the conductive layer 104 exposed by the mask 106 is fully etched, the preliminary conductive layer pattern 104a may be formed beneath the mask 106 only, and a portion of the insulation layer 102 adjacent to the preliminary conductive layer pattern 104a may be exposed. In case that the insulation layer 102 is partially exposed, nitrogen atoms may be injected into the insulation layer 102 and the substrate 100 in a successive nitrogen plasma treatment process, so that a threshold voltage of the transistor may vary and the transistor may have deteriorated electrical characteristics. Accordingly, the peripheral portion of the conductive layer 104 may not be completely etched to ensure desired electrical characteristics of the transistor. In other words, to prevent the nitrogen atoms from injecting into the insulation layer 102 and the substrate 100, the preliminary conductive layer pattern 104a may have the peripheral portion for preventing the nitrogen atoms from permeating into the insulation layer 102 and the substrate 100 although the central portion of the preliminary conductive layer pattern 104a may have a height considerably larger than that of the peripheral portion thereof.

Figure 5:
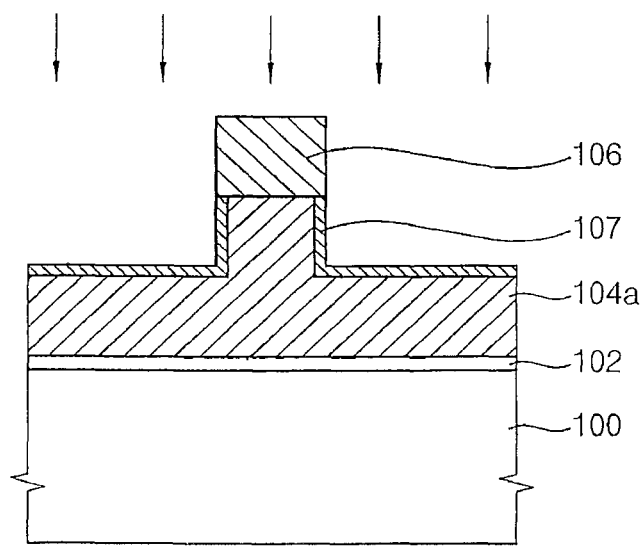

Referring to FIG. 5, a preliminary diffusion barrier layer 107 is formed on the preliminary conductive layer pattern 104a. The preliminary diffusion barrier layer 107 may be conformally formed on a sidewall of the central portion and the peripheral portion of the preliminary conductive layer pattern 104a. The preliminary diffusion barrier layer 107 may be formed by the nitrogen plasma treatment process. That is, the preliminary diffusion barrier layer 107 may be grown from the preliminary conductive layer pattern 104a in accordance with the reaction between the nitrogen atoms and silicon atoms in the preliminary conductive layer pattern 104a.

In example embodiments, the preliminary diffusion barrier layer 107 may be obtained by using a nitrogen-containing gas and by applying a power of about 0.5 kW to about 10 kW to a chamber in which the substrate 100 is loaded. The nitrogen-containing gas may include a nitrogen ($N_2$) gas, a nitric oxide (NO) gas, a nitrogen dioxide ($NO_2$) gas, a dinitrogen monoxide ($N_2O$) gas, an ammonia ($NH_3$) gas, etc. In some example embodiments, the nitrogen-containing gas may be introduced into the chamber with an inactive gas such as a helium (He) gas, an argon (Ar) gas, etc. The preliminary diffusion barrier layer 107 may have a thickness of about 5 Å to about 30 Å to efficiently prevent the diffusion of the impurities in a conductive layer pattern 110 (see FIG. 6) in successive processes without disturbing formations of a contact and/or a plug between adjacent electrode structures.

In example embodiments, the preliminary diffusion barrier layer 107 may be formed on the preliminary conductive layer pattern 104a while forming the preliminary conductive layer pattern 104a. Namely, the preliminary conductive layer pattern 104a and the preliminary diffusion barrier layer 107 may be formed in-situ. Alternatively, the preliminary conductive layer pattern 104a and the preliminary diffusion barrier layer 107 may be obtained out-situ. That is, the preliminary diffusion barrier layer 107 may be formed after forming the preliminary conductive layer pattern 104a.

After the formation of the preliminary diffusion barrier layer 107, the thickness of the preliminary conductive layer pattern 104a may be reduced by a thickness of the preliminary diffusion barrier layer 107. The central portion of the preliminary conductive layer pattern 104a may have a width reduced twice as much as the thickness of the preliminary diffusion barrier layer 107 because the preliminary diffusion barrier layer 107 is formed both sidewalls of the central portion of the preliminary conductive layer pattern 104a. Meanwhile, the peripheral portion of the preliminary conductive layer pattern 104a may have a thickness reduced as much as the thickness of the preliminary diffusion barrier layer 107.

Figure 6:
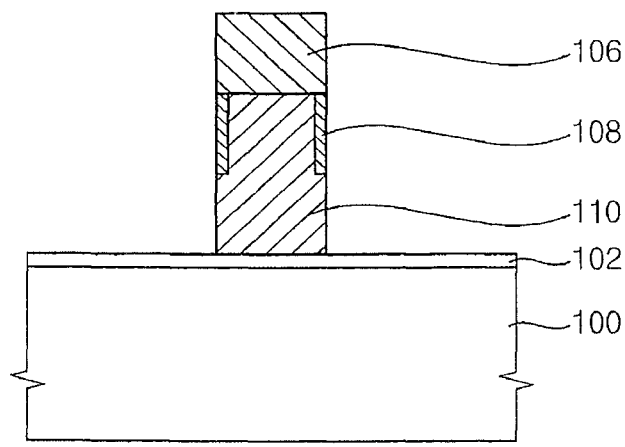

Referring to FIG. 6, the preliminary diffusion barrier layer 107 and the preliminary conductive layer pattern 104a are partially etched using the mask 106 as an etching mask. Thus, the conductive later pattern 110 and the diffusion barrier layer 108 are formed on the insulation layer 102. For example, the peripheral portion of the preliminary conductive layer pattern 104a is removed to form the conductive layer pattern 110. Here, the diffusion barrier layer 108 may be positioned on an upper sidewall of the conductive layer pattern 110. However, the area of the diffusion barrier layer 108 may be adjusted in accordance with the etched amount of the conductive layer 104 as described above.

When the diffusion barrier layer 108 is formed on a sidewall of the conductive layer pattern 110, the conductive layer pattern 110 may have a width substantially smaller than that of the mask 106. Hence, a lower portion of the conductive layer pattern 110 may be substantially wider than an upper portion of the conductive layer pattern 110.

In some example embodiments, an oxidation process may be performed on the conductive layer pattern 110 to cure damage to the conductive layer pattern 110 generated in an etching process for forming the conductive layer pattern 110. When the oxidation process is carried out at a relatively high temperature, the impurities in the conductive layer pattern 110 may be diffused into the insulation layer 102 and the substrate 100, so that a loss of the impurities may be generated in the conductive layer pattern 110. According to example embodiments, the impurities in the conductive layer pattern 110 may not be diffused because the diffusion barrier layer 108 is formed on the sidewall of the conductive layer pattern 110, thereby preventing the loss of the impurities from the conductive layer pattern 110.

Figure 7:
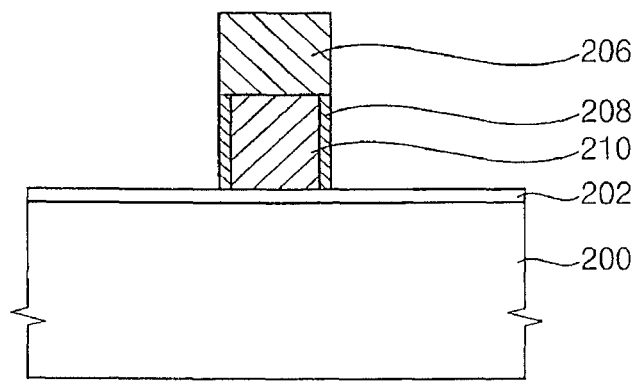
FIG. 7 is a cross sectional view illustrating an electrode structure in a semiconductor device according to some example embodiments.

FIG. 7 is a cross sectional view illustrating an electrode structure in a semiconductor device according to example embodiments.

Referring to FIG. 7, the electrode structure is provided on a substrate 200. The electrode structure includes an insulation layer 202, a conductive layer pattern 210, a diffusion barrier layer 208 and a mask 206. The insulation layer 202, the conductive layer pattern 210 and the mask 206 may have constructions substantially the same as or substantially similar to those of the insulation layer 102, the conductive layer pattern 110 and the mask 106 described with reference to FIG. 1. Further, the insulation layer 202, the conductive layer pattern 210 and the mask 206 may include materials substantially the same as or substantially similar to those of the insulation layer 102, the conductive layer pattern 110 and the mask 106, respectively.

The diffusion barrier layer 208 is formed on an entire sidewall of the conductive layer pattern 210. The diffusion barrier layer 208 may include silicon nitride caused from the conductive layer pattern 210. For example, the diffusion barrier layer 208 may be obtained by a nitration process using plasma when the conductive layer pattern 210 includes polysilicon doped with impurities.

According to example embodiments, the diffusion of the impurities in the conductive layer pattern 210 may be more effectively prevented because the diffusion barrier layer 210 encloses the entire sidewall of the conductive layer pattern 210. Thus, the semiconductor device such as a transistor may ensure improved electrical characteristics when the electrode structure is employed in the semiconductor device.

Figure 8:
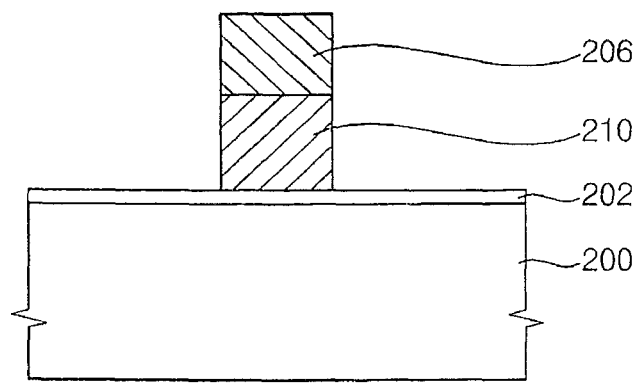
FIGS. 8 and 9 are cross sectional views illustrating a method of manufacturing an electrode structure in a semiconductor device according to some example embodiments.
Figure 9:
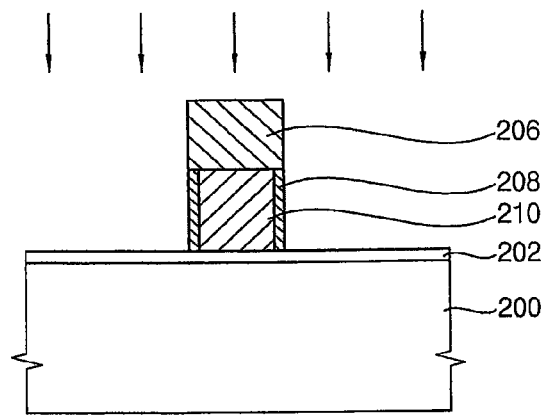

FIGS. 8 and 9 are cross sectional views illustrating a method of manufacturing an electrode structure in a semiconductor device according to example embodiments.

Referring to FIG. 8, an insulation layer 202 is formed on a substrate 200, and then a conductive layer (not illustrated) is formed on the insulation layer 202. The substrate 200 may include a semiconductor substrate or a substrate having a semiconductor layer. The insulation layer 202 may be formed using oxide and/or metal oxide by a thermal oxidation process, a CVD process, a high density plasma-chemical vapor deposition process, etc.

The conductive layer may be formed using polysilicon doped with impurities and the conductive layer may additionally include metal and/or metal compound. The conductive layer may be formed by a sputtering process, a CVD process, a PECVD process, an LPCVD process, etc. The impurities may be doped into the conductive layer by an in-situ doping process. The impurities in the conductive layer may include a conductive type varied in accordance with a conductive type of a transistor provided on the substrate 200.

After forming a mask 206 on the conductive layer, the conductive layer is partially etched to form a conductive layer pattern 210 on the insulation layer 202. The mask 206 may be obtained by patterning a mask formation layer (not illustrated) after the mask formation layer is provided on the conductive layer. The mask formation layer may be formed using silicon nitride or silicon oxynitride by a CVD process, an LPCVD process, a PECVD process, etc.

The conductive layer pattern 210 may have a width substantially the same as or substantially similar to that of the mask 206. The conductive layer pattern 210 may serve as a gate electrode in the transistor.

Referring to FIG. 9, a diffusion barrier layer 208 is formed on a sidewall of the conductive layer pattern 210. In example embodiments, the diffusion barrier layer 208 may cover an entire sidewall of the conductive layer pattern 210. The diffusion barrier layer 208 may include silicon nitride in accordance with the reaction between nitrogen and silicon when the conductive layer pattern 210 includes polysilicon. For example, the diffusion barrier layer 208 may be formed by a nitrogen plasma treatment process, so that the diffusion barrier layer 208 may be caused from the conductive layer pattern 210. The diffusion barrier layer 208 may be formed using a nitrogen-containing gas such as a nitrogen gas, a nitric oxide gas, a nitrogen dioxide gas, a dinitrogen monoxide gas, an ammonia gas, etc. The nitrogen-containing gas may be provided on the substrate 200 with an inactive gas such as a helium gas, an argon gas, etc. The diffusion barrier layer 208 may have a thickness of about 5 Å to about 30 Å based on the sidewall of the conductive layer pattern 210.

In some example embodiments, an additional oxidation process may be performed about the conductive layer pattern 210 to cure damage to the conductive layer pattern 210 generated in an etching process for forming the conductive layer pattern 210.

According to example embodiments, an additional etching process for etching the conductive layer pattern 210 may not be required after forming the diffusion barrier layer 208. Thus, etched damage to the conductive layer pattern 210 may be reduced and processes for forming the electrode structure may be simplified. When the diffusion barrier layer 208 encloses the entire sidewall of the conductive layer pattern 210, the semiconductor device including the electrode structure may have more improved electrical characteristics without any variation of threshold voltage thereof.

Figure 10:
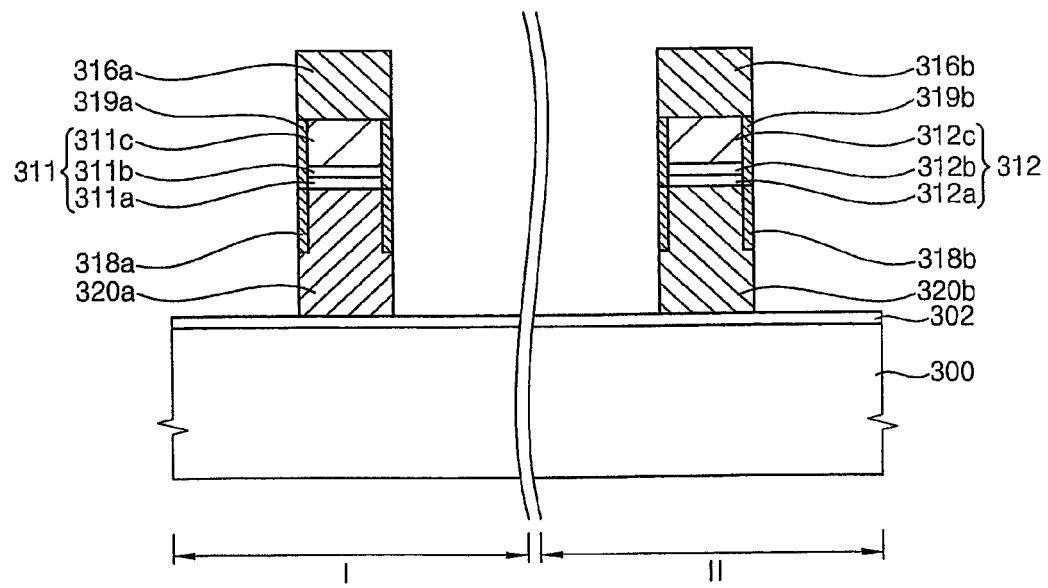
FIG. 10 is a cross sectional illustrating a semiconductor device having an electrode structure in accordance with example embodiments.

FIG. 10 is a cross-sectional view illustrating a semiconductor device having electrode structures in accordance with example embodiments.

Referring to FIG. 10, the semiconductor device includes a first electrode structure and a second electrode structure. The first electrode structure is positioned in a first area I of a substrate 300, and the second electrode structure is provided in a second area II of the substrate 300. The first electrode structure includes an insulation layer 302, a first conductive layer pattern 320*a*, a first metal-containing layer pattern 311, a first mask 316*a*, a first diffusion barrier layer 318*a* and a second diffusion barrier layer 319*a*. The second electrode structure includes the insulation layer 302, a second conductive layer pattern 320*b*, a second metal-containing layer pattern 312, a second mask 316*b*, a third diffusion barrier layer 318*b* and a fourth diffusion barrier layer 319*b*.

In example embodiments, different transistors may be formed on the substrate 300. For example, an N type MOS (NMOS) transistor may be located in the first area I of the substrate 300 whereas a P type MOS (PMOS) transistor may be formed in the second area II of the substrate 300. The substrate 300 may include a semiconductor substrate or a substrate having a semiconductor layer.

The insulation layer 302 is positioned on the substrate 300. The insulation layer 302 may serve as gate insulation layers of the transistors. For example, a first portion of the insulation layer 302 in the first area I may serve as a gate insulation layer of the NMOS transistor, and a second portion of the insulation layer 302 in the second area II may function as a gate insulation layer of the PMOS transistor. The insulation layer 302 may include silicon oxide and/or metal oxide.

The first conductive layer pattern 320a is provided on the insulation layer 302 in the first area I of the substrate 300. The first conductive layer pattern 320a may include polysilicon doped with N type impurities when the NMOS transistor is required in the first area I. Examples of the impurities in the first conductive layer pattern 320a may include phosphorus (P), arsenic (As), etc.

The first metal-containing layer pattern 311 includes a first metal compound layer pattern 311a, a second metal compound layer pattern 311b and a first metal layer pattern 311c. With the first metal-containing layer pattern 311, the first electrode structure may have a reduced resistance. The first metal compound layer pattern 311a may serve as a barrier metal layer of a first gate electrode when the first electrode structure is used as the first gate electrode of the NMOS transistor. The first metal compound layer pattern 311a may include metal and/or metal nitride. For example, the first metal compound layer pattern 311a may include titanium, tungsten, tantalum, aluminum, titanium nitride, tungsten nitride, tantalum nitride, aluminum nitride, etc. These may be used alone or in a mixture thereof.

The second metal compound layer pattern 311b may include metal, metal nitride and/or metal silicide. For example, the second metal compound layer pattern 311b may include titanium, tungsten, tantalum, aluminum, titanium nitride, tungsten nitride, tantalum nitride, aluminum nitride, cobalt silicide, titanium silicide, nickel silicide, tungsten silicide, etc. These may be used alone or in a mixture thereof. The first metal layer pattern 311c may include titanium, tungsten, tantalum, aluminum, copper, platinum, etc. These may be used alone or in a mixture thereof.

In some example embodiments, the first metal-containing layer pattern 311 may have a double layer structure that includes a metal compound layer pattern and a metal layer pattern. Here, the metal compound layer may serve as the barrier layer of the first gate electrode in the NMOS transistor. Alternatively, the first metal-containing layer pattern 311 may include one of a metal compound layer pattern and a metal layer pattern.

The first diffusion barrier layer 318a is positioned on a sidewall of the first conductive layer pattern 320a, and the second diffusion barrier layer 319a is located on a sidewall of the first metal-containing layer pattern 311. The first diffusion barrier layer 318a may prevent the impurities in the first conductive layer pattern 320a from diffusing into the insulation layer 302, the substrate 300 and/or a contact or a plug formed adjacent to the first electrode structure. The second diffusion barrier layer 319a may also prevent the diffusion of metal atoms from the first metal-containing layer pattern 311 toward the insulation layer 302, the substrate 300 and/or the contact or the plug formed adjacent to the first electrode structure.

The first second diffusion barrier layer 318a and the second diffusion barrier layer 319a may be generated from the first conductive layer pattern 320a and the first metal-containing layer pattern 311, respectively. For example, the first and the second diffusion barrier layers 318a and 319a may be obtained by a plasma treatment process. The first diffusion barrier layer 318a may include silicon nitride and the second diffusion barrier layer 319a may include metal nitride when the first conductive layer pattern 320a and the first metal-containing layer pattern 311 are processed using a plasma generated from a nitrogen-containing gas.

In example embodiments, the first diffusion barrier layer 318a may partially cover the sidewall of the first conductive layer pattern 320a. For example, the first diffusion barrier layer 318a may enclose an upper sidewall of the first conductive layer pattern 320a. Alternatively, the first diffusion barrier layer 318a may be provided on an entire sidewall of the first conductive layer pattern 320a. The second diffusion barrier layer 319a may cover an entire sidewall of the first metal-containing layer pattern 311.

The first diffusion barrier layer 318a may have a thickness substantially the same as or substantially similar to that of the second diffusion barrier layer 319a. For example, each of the first and the second diffusion barrier layers 318a and 319a may have a thickness in a range of about 5 Å to about 30 Å. When the first diffusion barrier layer 318a has a relatively thin thickness, the first diffusion barrier layer 318a may not reduce a width of the contact or the plug formed between adjacent first conductive layer patterns while effectively preventing the diffusion of the impurities from the first conductive layer pattern 320a. Additionally, the contamination of the semiconductor device caused by metal in the first metal-containing layer pattern 311 may be efficiently prevented by the second diffusion barrier layer 319a having a relatively thin thickness without consuming the first metal-containing layer pattern 311.

When the first diffusion barrier layer 318a is formed on the upper sidewall of the first conductive layer pattern 320a, an upper portion of the first conductive layer pattern 320a may have a width substantially smaller than that of a lower portion thereof. Further, the first metal-containing layer pattern 311 may have a width substantially the same as or substantially similar to that of the upper portion of the first conductive layer pattern 320a.

The first mask 316a may include nitride or oxynitride that has an etching selectivity with respect to the first metal-containing layer pattern 311 and the first conductive layer pattern 320a. For example, the first mask 316a may include silicon nitride or silicon oxynitride. The first mask 316a may have a width substantially the same as or substantially similar to that of the first metal-containing layer pattern 311.

In some example embodiments, first source/drain regions may be provided at portions of the first area I adjacent to the first electrode structure. When the NMOS transistor is formed in the first area I, the first source/drain regions may include N type impurities.

Referring now to FIG. 10, the second conductive layer pattern 320b is positioned on the second portion of the insulation layer 302 in the second area II of the substrate 300. The second conductive layer pattern 320b may include polysilicon doped with P type impurities when the PMOS transistor is provided in the second area II of the substrate 300. Examples of the P type impurities in the second conductive layer pattern 320b may include boron, indium, aluminum, etc. The second conductive layer pattern 320b including the P type impurities may have a work function substantially larger than the first conductive layer pattern 320a including the N type impurities. Accordingly, the PMOS transistor may have an improved threshold voltage. Further, an off current of the PMOS transistor may be efficiently controlled.

The second metal-containing layer pattern 312 includes a third metal compound layer pattern 312a, a fourth metal compound layer pattern 312b and a second metal layer pattern 312c.

Owing to the second metal-containing layer pattern 312, the second electrode structure may also have a reduced resistance. The third metal compound layer pattern 312a may serve as a barrier metal layer of a second gate electrode when the second electrode structure is used as the second gate electrode of the PMOS transistor. The third metal compound layer pattern 312a may also include metal and/or metal nitride. For example, the second metal compound layer pattern 312a may include titanium, tungsten, tantalum, aluminum, titanium nitride, tungsten nitride, tantalum nitride, aluminum nitride, etc. These may be used alone or in a mixture thereof. The fourth metal compound layer pattern 312b may include metal, metal nitride and/or metal silicide. For example, the fourth metal compound layer pattern 312b may include titanium, tungsten, tantalum, aluminum, titanium nitride, tungsten nitride, tantalum nitride, aluminum nitride, cobalt silicide, titanium silicide, nickel silicide, tungsten silicide, etc. These may be used alone or in a mixture thereof. The second metal layer pattern 312c may include titanium, tungsten, tantalum, aluminum, copper, platinum, etc. These may be used alone or in a mixture thereof.

In some example embodiments, the second metal-containing layer pattern 312 may have a double layer structure that includes an additional metal compound layer pattern and an additional metal layer pattern. Here, the additional metal compound layer may serve as the barrier layer of the second gate electrode in the PMOS transistor. Alternatively, the second metal-containing layer pattern 312 may include one of an additional metal compound layer pattern and an additional metal layer pattern.

The third diffusion barrier layer 318b is located on a sidewall of the second conductive layer pattern 320b, and the fourth diffusion barrier layer 319b is provided on a sidewall of the second metal-containing layer pattern 312. The third diffusion barrier layer 318b may prevent the diffusion of the impurities from the second conductive layer pattern 320b into the insulation layer 302, the substrate 300 and/or a contact or a plug formed adjacent to the second electrode structure. The fourth diffusion barrier layer 319b may also prevent metal in the second metal-containing layer pattern 312 into the insulation layer 302, the substrate 300 and/or the contact or the plug formed adjacent to the second electrode structure.

The third diffusion barrier layer 318b and the fourth diffusion barrier layer 319b may also be caused from the second conductive layer pattern 320b and the second metal-containing layer pattern 312, respectively. For example, the third and the fourth diffusion barrier layers 318b and 319b may be formed by a plasma treatment process. In example embodiments, the first to the fourth diffusion barrier layers 318a, 319a, 318b and 319b may be simultaneously formed by one plasma treatment process. The third diffusion barrier layer 318b may include silicon nitride and the fourth diffusion barrier layer 319b may include metal nitride when the second conductive layer pattern 320b and the first metal-containing layer pattern 312 are treated using a nitrogen plasma generated from a nitrogen-containing gas.

In example embodiments, the third diffusion barrier layer 318b may partially cover the sidewall of the second conductive layer pattern 320b. For example, the third diffusion barrier layer 318b may enclose an upper sidewall of the second conductive layer pattern 320b. Alternatively, the third diffusion barrier layer 318b may enclose an entire sidewall of the second conductive layer pattern 320b. The fourth diffusion barrier layer 319b may cover an entire sidewall of the second metal-containing layer pattern 312.

The third diffusion barrier layer 318b may have a thickness substantially the same as or substantially similar to that of the fourth diffusion barrier layer 319b. Each of the third and the fourth diffusion barrier layers 318b and 319b may have a relatively thin thickness in a range of about 5 Å to about 30 Å. When the third diffusion barrier layer 318b has the relatively thin thickness, the third diffusion barrier layer 318b may not reduce a width of the contact or the plug formed between adjacent second conductive layer patterns while effectively preventing the diffusion of the impurities from the second conductive layer pattern 320b. Further, the contamination of the semiconductor device caused by metal in the second metal-containing layer pattern 312 may be effectively prevented by the fourth diffusion barrier layer 319b having the relatively thin thickness without consuming the second metal-containing layer pattern 312. In case that the third diffusion barrier layer 318b encloses the upper sidewall of the second conductive layer pattern 320b, an upper portion of the second conductive layer pattern 320b may have a width substantially smaller than that of a lower portion thereof. The second metal-containing layer pattern 312 may also have a width substantially the same as or substantially similar to that of the upper portion of the second conductive layer pattern 320b.

The second mask 316b may include nitride or oxynitride having an etching selectivity relative to the second metal-containing layer pattern 312 and the second conductive layer pattern 320b. For example, the first mask 316a may include silicon nitride or silicon oxynitride. The second mask 316b may have a width substantially the same as or substantially similar to that of the second metal-containing layer pattern 312.

In some example embodiments, second source/drain regions may be formed at portions of the second area II adjacent to the second electrode structure. When the PMOS transistor is formed in the second area II, the second source/drain regions may include P type impurities, too.

According to example embodiments, a plurality of diffusion barrier layers may be provided on a sidewall of an electrode structure so that impurities and metal atoms may not diffuse toward an insulation layer, a substrate, a contact or a plug. Further, a contamination of a semiconductor device caused by the metal in the electrode structure may be prevented. Therefore, the semiconductor device may ensure improved electrical characteristics without any metal contamination thereof.

FIGS. 11 to 15 are cross sectional views illustrating a method of manufacturing a semiconductor device having electrode structures in accordance with example embodiments.

Figure 11:
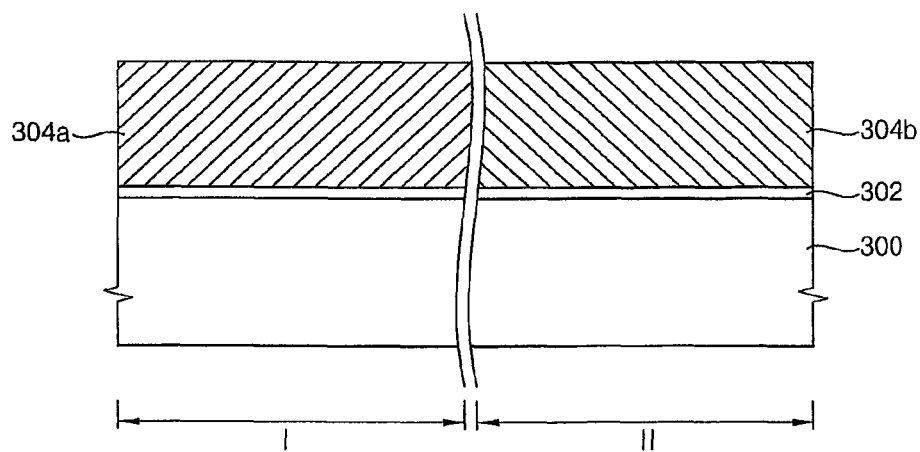
FIGS. 11 to 15 are cross sectional views illustrating a method of manufacturing a semiconductor device having an electrode structure in accordance with some example embodiments.

Referring to FIG. 11, an insulation layer 302 is formed on a substrate 300 having a first area I and a second area II. When the semiconductor device includes an NMOS transistor and a PMOS transistor, the NMOS and the PMOS transistors may be formed in the first and the second areas I and II, respectively.

The insulation layer 302 may be formed using silicon oxide or metal oxide by a CVD process, a thermal oxidation process, an ALD process, etc. The insulation layer 302 may serve as a gate insulation layer for the NMOS and the PMOS transistors.

A first conductive layer 304a and a second conductive layer 304b are formed on the insulation layer 302. The first conductive layer 304a is positioned in the first area I and the second conductive layer 304b is located in the second area II. Each of the first and the second conductive layers 304a and 304b may be formed using polysilicon by a CVD process, a PECVD process, an LPCVD process, etc. When the first and the second conductive layer s 304a and 304b include polysilicon, N type impurities may be doped into the first conductive layer 304a whereas P type impurities may be included in the second conductive layer 304b. Further, each of the first and the second conductive layers 304a and 304b may include metal and/or metal compound.

In example embodiments, after a polysilicon layer may be formed on the insulation layer 302, the N type impurities may be doped into a first portion of the polysilicon layer in the first area I. Then, the P type impurities may be doped into a second portion of the polysilicon layer in the second area II. Thus, the first and the second conductive layers 304a and 304b may be provided on the insulation layer 302. Here, the first and the second portions of the polysilicon layer may correspond to the first and the second conductive layers 304a and 304b, respectively.

In some example embodiments, the first conductive layer 304a may be formed using polysilicon on a first portion of the insulation layer 302 in the first area I while doping the N type impurities into the first conductive layer 304a in-situ. Then, the second conductive layer 304b may be formed using polysilicon on a second portion of the insulation layer 302 while doping the P type impurities into the second conductive layer 304b in-situ.

In other example embodiments, a polysilicon layer may be formed on the insulation layer 302 while doping the P type impurities into the polysilicon layer in-situ. Then, the N type impurities may be selectively doped into the first portion of the polysilicon layer to provide the first conductive layer 304a on the insulation layer 302. Here, a remaining portion of the polysilicon layer doped with the P type impurities may correspond to the second conductive layer 304b.

Figure 12:
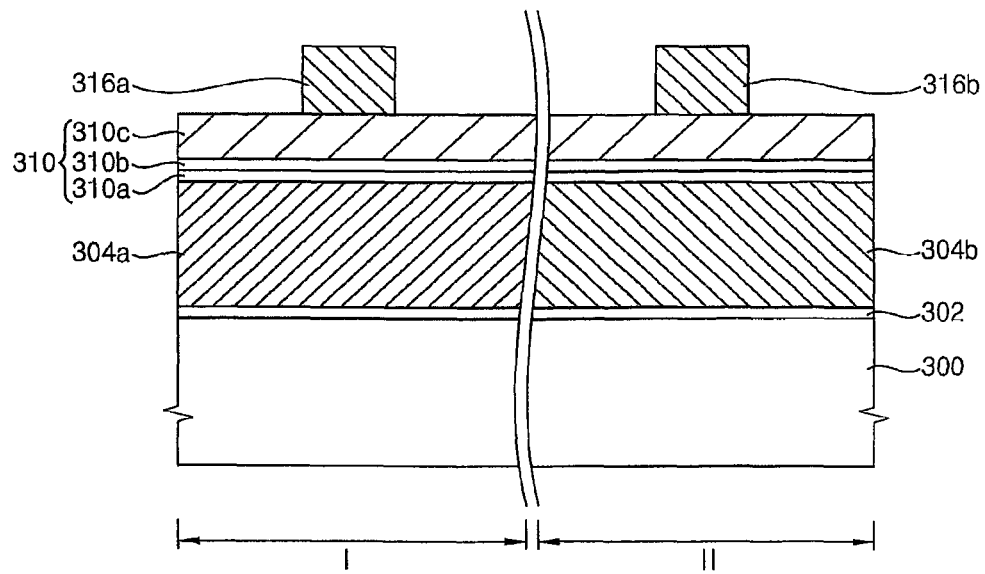

Referring to FIG. 12, a metal-containing layer 310 is formed on the first and the second conductive layers 304a and 304b. The metal-containing layer 310 may be formed using metal and/or metal compound such as metal nitride, metal silicide, etc. Further, the metal-containing layer 310 may be obtained by a sputtering process, a CVD process, an ALD process, an evaporation process, a pulsed laser deposition (PLD) process, etc.

In example embodiments, the metal-containing layer 310 includes a lower metal compound layer 310a, an upper metal compound layer 310b and a metal layer 310c. Each of the metal compound layers 310a and 310b and the metal layer 310c may be formed using metal and/or metal nitride. For example, the lower metal compound layer 310a may include titanium nitride and the upper metal compound layer 310b may include tungsten nitride. Further, the metal layer 310c may be formed using tungsten.

A first mask 316a and a second mask 316b are formed on the metal-containing layer 310 by a predetermined distance. Each of the first and the second masks 316a and 316b may be formed using silicon nitride or silicon oxynitride by a CVD process, a PECVD process, an LPCVD process, etc. The first mask 316a and the second mask 316b may be positioned in the first area I and the second area II, respectively. That is, the first mask 316a may be positioned over the first conductive layer 304a and the second mask 316b may be formed over the second conductive layer 304b.

Figure 13:
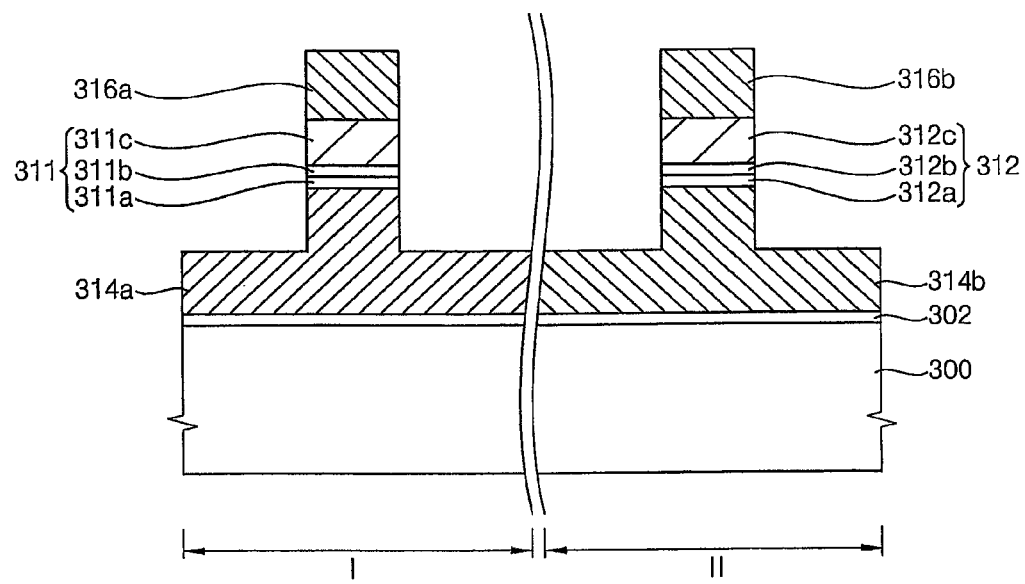

Referring to FIG. 13, the metal-containing layer 310 is partially etched using the first and the second masks 316a and 316b as etching masks. Hence, a first metal-containing layer pattern 311 and a first preliminary conductive layer pattern 314a are formed on the first portion of the insulation layer 302 in the first area I. Additionally, a second metal-containing layer pattern 312 and a second preliminary conductive layer pattern 314b are provided on the second portion of the insulation layer 302 in the second area II.

The first metal-containing layer pattern 311 includes a first metal compound layer pattern 311a, a second metal compound layer pattern 311b and a first metal layer pattern 311c. The first metal-containing layer pattern 311 may be positioned on an upper portion of the first preliminary conductive layer pattern 314a in the first area I. The upper portion of the first conductive layer pattern 314a may be protruded from a peripheral portion of the first conductive layer pattern 314a after partially etching the first conductive layer 304a.

The second metal-containing layer pattern 312 includes a third metal compound layer pattern 312a, a fourth metal compound layer pattern 312b and a second metal layer pattern 312c. The second metal-containing layer pattern 312 may be located on an upper portion of the second preliminary conductive layer pattern 314b in second first area I. The upper portion of the second conductive layer pattern 314b may also be protruded from a peripheral portion of the second conductive layer pattern 314b by partially etching the second conductive layer 304b.

In example embodiments, the first and the second metal-containing layer patterns 311 and 312 may have widths substantially the same as or substantially similar to those of the first and the second masks 316a and 316b. Further, the upper portions of the first and the second preliminary conductive layer patterns 316a and 316b may have widths substantially the same as or substantially similar to those of the first and the second masks 316a and 316b.

Figure 14:
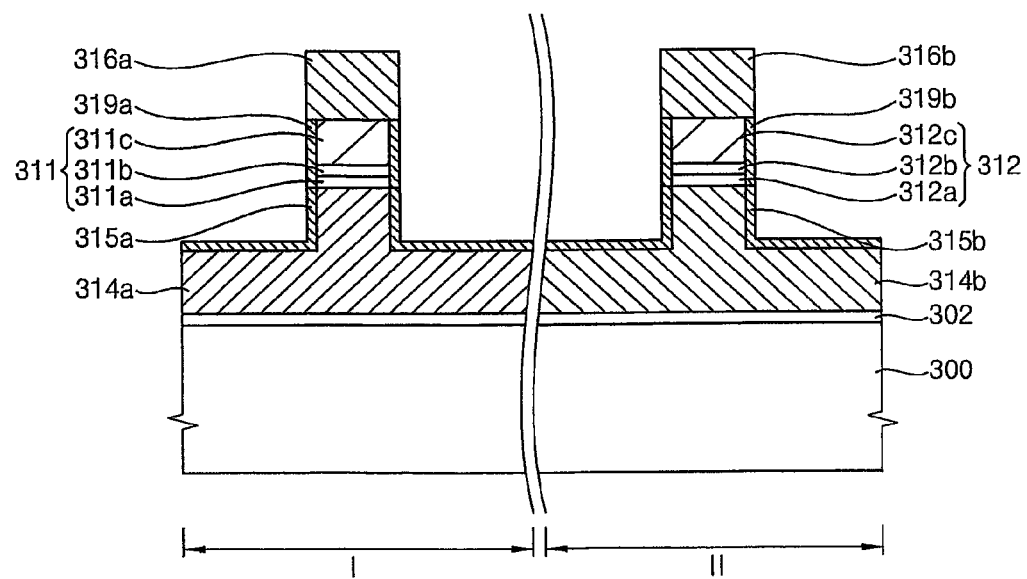

Referring to FIG. 14, a first preliminary diffusion barrier layer 315a is formed on the first preliminary conductive layer pattern 314a in the first area I, and a second preliminary diffusion barrier layer 315b is formed on the second preliminary conductive layer pattern 314b in the second area II. Further, a second diffusion barrier layer 319a is formed on a sidewall of the first metal-containing layer pattern 311 in the first area I and a fourth diffusion barrier layer 319b is formed on a sidewall of the second metal-containing layer pattern 312 in the second area II.

In example embodiments, the first and the second preliminary diffusion barrier layers 315a and 315b may be formed by a plasma nitration process. Additionally, the second and the fourth diffusion barrier layers 319a and 319b may be obtained by the plasma treatment process. That is, the plasma nitration process may be carried out to simultaneously form the first preliminary diffusion barrier layer 315a, the second preliminary diffusion barrier layer 315, the second barrier layer 319a and the fourth barrier layer 319b. The plasma may be generated from a nitrogen-containing gas.

The first and the second preliminary diffusion barrier layers 315a and 315b may cover the peripheral portions of the first and the second preliminary conductive layer patterns 314a and 314b, respectively. Additionally, sidewalls of the upper portions of the first and the second preliminary conductive layer patterns 314a and 314b may be covered with the first and the second preliminary diffusion barrier layers 315a and 315b. Each of the second barrier layer 319a and the fourth barrier layer 319b may have a thickness of about 5 Å to about 30 Å. Each of the first and the second preliminary diffusion barrier layers 315a and 315b may also have a thickness in a range of about 5 Å to about 30 Å.

In some example embodiments, the first and the second preliminary diffusion barrier layers 315a and 315b and the second and the fourth diffusion barrier layers 319a and 319b may be formed while partially etching the first and the second metal-containing layers 311 and 312 and the first and the second conductive layers 304a and 304b.

Figure 15:
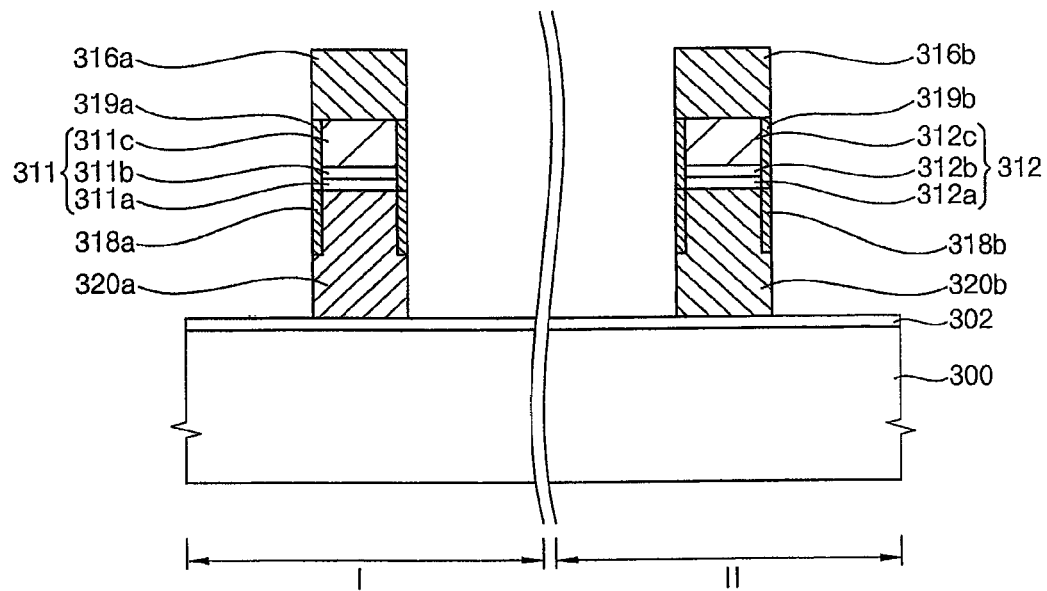

Referring to FIG. 15, the first and the second preliminary barrier layers 315a and 315b are etched while partially etching the first and the second preliminary conductive layer patterns 314a and 314b. Thus, a first conductive layer pattern 320a and a first diffusion barrier layer 318a are formed in the first area I, and a second conductive layer pattern 320b and a third diffusion barrier layer 318b are provided in the second area II. The first diffusion barrier layer 318a may be positioned on an upper sidewall of the first conductive layer pattern 320a on the first portion of the insulation layer 302. The second diffusion barrier layer 318b may be also located in an upper sidewall of the second conductive layer pattern 320b.

After etching the first and the second preliminary barrier layers 315a and 315b and the first and the second preliminary conductive layer patterns 314a and 314b, a first electrode structure and a second electrode structure are formed in the first area I and the second area II. The first electrode structure includes the insulation layer 302, the first conductive layer pattern 320a, the first metal-containing layer pattern 311, the first mask 316a, the first diffusion barrier layer 318a and the second diffusion barrier layer 319a. Similarly, second electrode structure includes the insulation layer 302, the second conductive layer pattern 320b, the second metal-containing layer pattern 312, the second mask 316b, the third diffusion barrier layer 318b and the fourth diffusion barrier layer 319b.

In example embodiments, the second and the fourth diffusion barrier layers 319a and 319b may make contact with the first and the third diffusion barrier layers 318a and 318b, respectively. Each of the first and the third diffusion barrier layers 318a and 318b may include silicon nitride whereas each of the second and the fourth diffusion barrier layers 319a and 319b may include metal nitride.

In some example embodiments, an additional oxidation process may be performed on sidewalls of the first and the second conductive layer patterns 320a and 320b to cure etched damages to the first and the second conductive layer patterns 320a and 320b generated in the etching processes.

According to example embodiments, each of electrode structures may include two diffusion barrier layers of different materials, such that the diffusion of impurities and metal atoms from the electrode structures may be effectively prevented. Therefore, the semiconductor device including the electrode structures may have enhanced electric characteristics while preventing contamination thereof.

In example embodiments, impurities may be doped into portions of the substrate 300 adjacent to the first and the second electrodes. Hence, first source/drain regions may be formed adjacent to the first electrode structure in the first area I and second source/drain regions may be obtained adjacent to the second electrode structure in the second area II. Here, the first source/drain regions may include N type impurities whereas the second source/drain regions may include P type impurities when the NMOS transistor is required in the first area I and the PMOS transistor is formed in the second area II.

Figure 16:
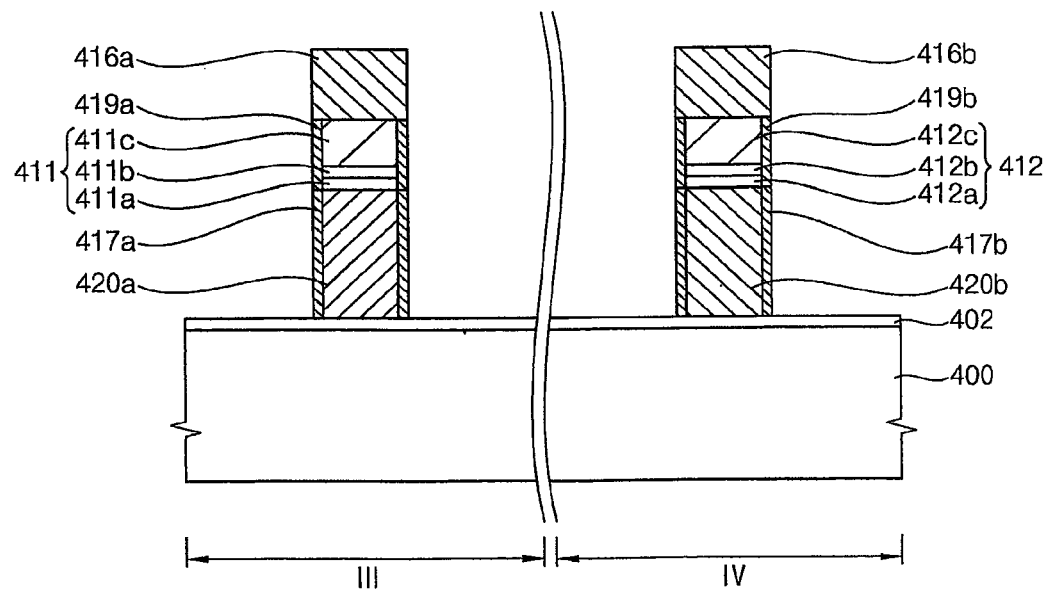
FIG. 16 is a cross sectional view illustrating a semiconductor device having an electrode structure in accordance with some example embodiments.

FIG. 16 is a cross-sectional view illustrating a semiconductor device having electrode structures in accordance with example embodiments.

As for the semiconductor device illustrated in FIG. 16, a first electrode structure and a second electrode structure may have constructions and materials substantially similar to those of the first electrode structure and the second structure described with reference to FIG. 10 except for a first diffusion barrier layer 417a and a third diffusion barrier layer 417b.

Referring to FIG. 16, the first electrode structure and the second electrode structure may be positioned in a first area III and a second area IV of a substrate 400 on which an insulation layer 402 is formed. For example, an NMOS transistor may be provided in the first area III of the substrate 400, and a PMOS transistor may be formed in the second area IV of the substrate 400.

The first electrode structure includes the insulation layer 402, a first conductive layer pattern 430a, a first metal-containing layer pattern 411, a first mask 416a, the first diffusion barrier layer 418a and a second diffusion barrier layer 419a. The second electrode structure includes the insulation layer 402, a second conductive layer pattern 430b, a second-containing layer pattern 412, a second mask 416b, the third diffusion barrier layer 417b and a fourth diffusion barrier layer 419b. The first metal-containing layer pattern 411 includes a first metal compound layer pattern 411a, a second metal compound layer pattern 411b and a first metal layer pattern 411c successively formed on the first conductive layer pattern 430a. Further, the second metal-containing layer pattern 412 includes a third metal compound layer pattern 412a, a fourth metal compound layer pattern 412b and a second metal layer pattern 412c sequentially formed on the second conductive layer pattern 430b.

In example embodiments, the first and the third diffusion barrier layer 417a and 417b may enclose entire sidewalls of the first and the second conductive layer patterns 430a and 430b, respectively. Thus, the diffusion of impurities from the first and the second conductive layer patterns 430a and 430b may be more effectively prevented while reducing the contamination of the semiconductor device caused by metal atoms in the first and the second metal-containing layer patterns 411 and 412.

Figure 17:
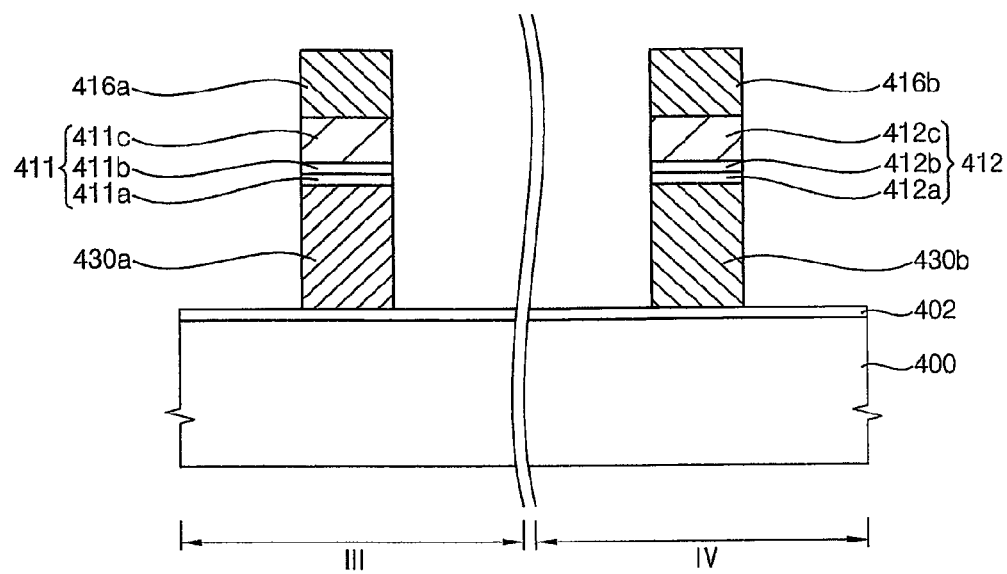
FIGS. 17 and 18 are cross sectional views illustrating a method of manufacturing a semiconductor device having an electrode structure in accordance with some example embodiments.
Figure 18:
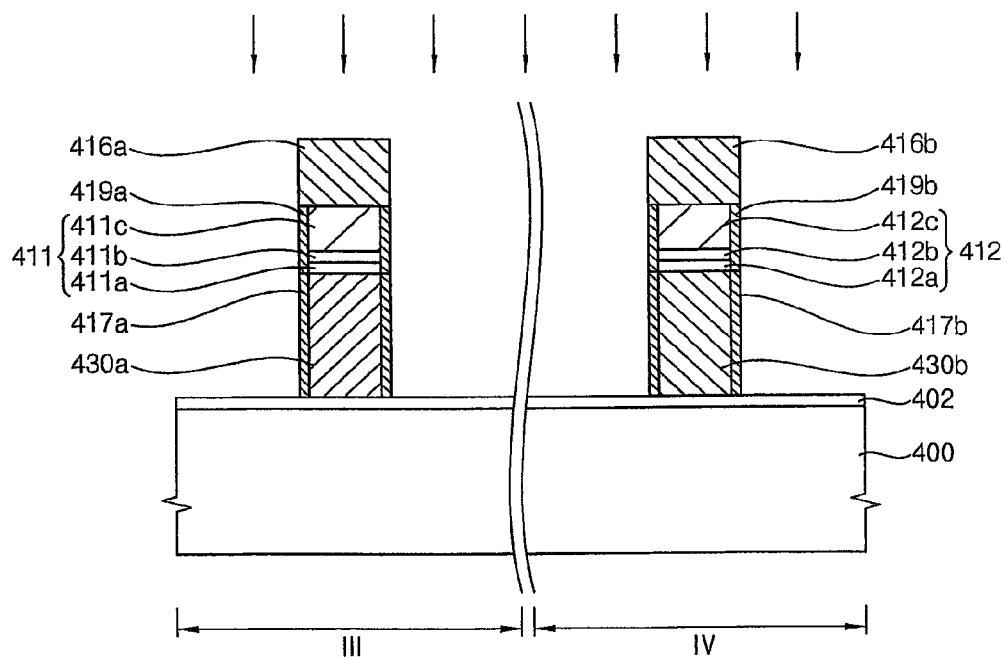

FIGS. 17 and 18 are cross sectional views illustrating a method of manufacturing a semiconductor device having electrode structures in accordance with example embodiments.

Referring to FIG. 17, after an insulation layer 402 is formed on a substrate 400 having a first area III and a second area IV, a first conductive layer pattern 430a and a first metal-containing layer pattern 411 are formed in the first area III using a first mask 416a as an etching mask. Additionally, a second conductive layer pattern 430b and a second metal-containing layer pattern 412 are formed in the second area IV using a second mask 416b as an etching mask.

The first metal-containing layer pattern 411 in the first area III includes a first metal compound layer pattern 411a, a second metal compound layer pattern 411b and a first metal layer patter 411c. Similarly, the second metal-containing layer pattern 412 in the second area IV includes a third metal compound layer pattern 412a, a fourth metal compound layer pattern 412b and a second metal layer patter 412c.

Referring to FIG. 18, a nitration process may be performed about the first conductive layer pattern 430a, the first metal-containing layer pattern 411, the second conductive layer pattern 430b and the second metal-containing layer pattern 412. Thus, a first diffusion barrier layer 417a and a second diffusion barrier layer 419a are formed in the first area III, and a third diffusion barrier layer 417b and a fourth diffusion barrier layer 419b are provided in the second area IV. The nitration process may be executed using plasma generated from a gas including nitrogen.

The first diffusion barrier layer 417a may be formed an entire sidewall of the first conductive layer pattern 430a. The second diffusion barrier layer 419a is generated on a sidewall of the first metal-containing layer pattern 419a. The third diffusion barrier layer 417b may also be positioned on an entire sidewall of the second conductive layer pattern 430b, and the fourth diffusion barrier layer 419b may be located on a sidewall of the second metal-containing layer pattern 412. The first diffusion barrier layer 417a may be connected to the second diffusion barrier layer 419a, and the third diffusion barrier layer 417b is also connected to the fourth diffusion barrier layer 419b. Because the first and the third diffusion barrier layers 417a and 417b covers the entire sidewalls of the first and the second electrode structures, the diffusion of impurities from the first and the second electrode structures may be more efficiently prevented to effectively ensure electric characteristics of the semiconductor device.

In example embodiments, each of the first and the third diffusion barrier layers 417a and 417b may include silicon nitride when the first and the second conductive layer patterns 430a and 430b includes polysilicon. Further, the second and the fourth diffusion barrier layers 419a and 419b may include metal nitride because of the first and the second metal-containing layer patterns 411 and 412.

After the formations of the first to the fourth diffusion barrier layers 417a, 417b, 419a and 419b, a first electrode structure and a second electrode structure are formed in the first area III and the second area IV, respectively.

In example embodiments, first impurities may be implanted into a first portion of the substrate 400 adjacent to the first electrode structure to form first source/drain regions in the first area III. Additionally, second impurities may be doped into a second portion of the substrate 400 adjacent to the second electrode structure, so that second source/drain regions may be formed in the second area IV. Accordingly, the NMOS and the PMOS transistors may be provided in the first and the second areas III and IV of the substrate 400.

Figure 19:
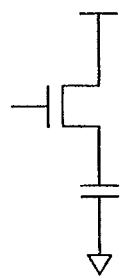
FIG. 19 is a circuit diagram illustrating a semiconductor memory device in accordance with example embodiments.

FIG. 19 is a circuit diagram illustrating a semiconductor memory device in accordance with example embodiments. The semiconductor device illustrated in FIG. 19 may correspond to a volatile semiconductor memory device such as a dynamic random access memory (DRAM) device. The semiconductor device in FIG. 19 may include an NMOS transistor or a PMOS transistor, which includes an electrode structure that has a construction substantially the same as or substantially similar to that of the above-described electrode structure.

Referring to FIG. 19, the semiconductor memory device may ensure improved electrical characteristics by preventing the diffusion of impurities and by reducing the metal contamination when the semiconductor memory device includes the electrode structure having at least one diffusion barrier layer.

Figure 20:
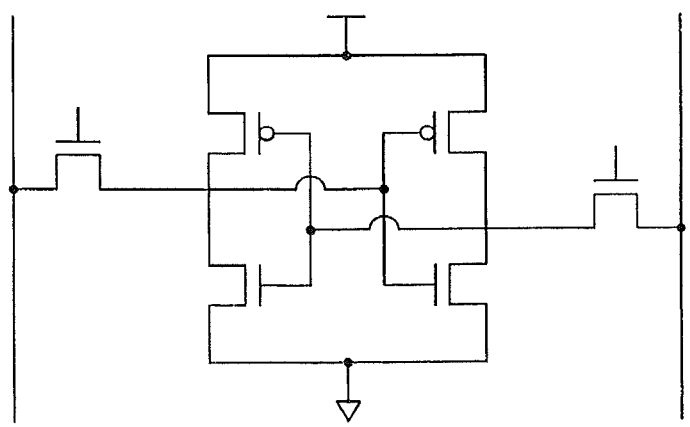
FIG. 20 is a circuit diagram illustrating a semiconductor memory device in accordance with some example embodiments.

FIG. 20 is a circuit diagram illustrating a semiconductor memory device in accordance other example embodiments. The semiconductor memory device illustrated in FIG. 20 may correspond to a static random access memory (SRAM) device.

As illustrated in FIG. 20, the semiconductor memory device may include an NMOS transistor and a PMOS transistor wherein each of the NMOS and the PMOS transistors includes an electrode structure a construction substantially the same as or substantially similar to that of the above-described electrode structure. Because the electrode structures of the NMOS and the PMOS transistors include at least one diffusion barrier layer, the semiconductor memory device may have enhanced electrical characteristics while preventing the diffusion of impurities and the contamination caused by metal.

Figure 21:
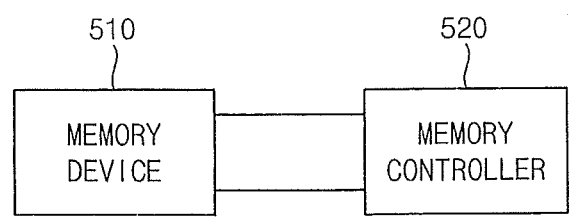
FIG. 21 is a block diagram illustrating a memory system in accordance with example embodiments.

FIG. 21 is a block diagram illustrating a memory system in accordance with example embodiments;

Referring to FIG. 21, the memory system includes a memory controller 520 and a memory device 510 electrically connected to the memory controller 520. The memory device 510 may include a semiconductor device having at least one electrode structure formed through the above-described processes. For example, the memory device 510 may include a semiconductor device having an NMOS transistor and/or a PMOS transistor. Each of the NMOS and the PMOS transistors may include an electrode structure that has at least one diffusion barrier layer.

The memory controller 520 may provide an input signal into the memory device 510 to control the reading and the erasing operations of the memory device 510. For example, various signals such as command (CMD), address (ADD), input/output data (DQ) or a high-voltage (VPP) signal may be applied to the memory controller 520. The memory controller 520 may control the memory device 510 based on the applied various signals. The memory system may be employed in various electronic apparatuses such as a cellular phone, a portable multimedia player, a digital camera, etc.

Figure 22:
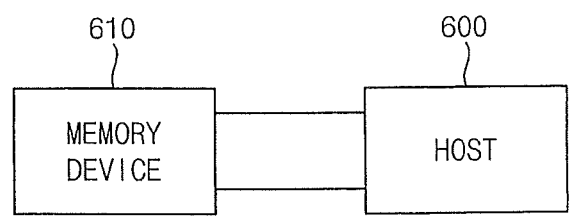
FIG. 22 is a block diagram illustrating another memory system in accordance with example embodiments.

FIG. 22 is a block diagram illustrating a memory system in accordance with other example embodiments.

Referring to FIG. 22, the memory system including a memory device 610 may be electrically connected to a host system 600. The memory device 610 may include a semiconductor device having at least one electrode structure formed by the above-described processes. For example, the memory device 610 may include a semiconductor device having an NMOS transistor and/or a PMOS transistor wherein each of the NMOS and the PMOS transistors may include an electrode structure that has at least one diffusion barrier layer.

The host system 600 may include various electronic apparatuses such as a personal computer, a digital camera, a mobile communication apparatus, a portable video player, etc. The host system 600 may apply various signals into the memory device 610 to control the memory device 610, and the memory device 610 may serve as a storage medium.

Figure 23:
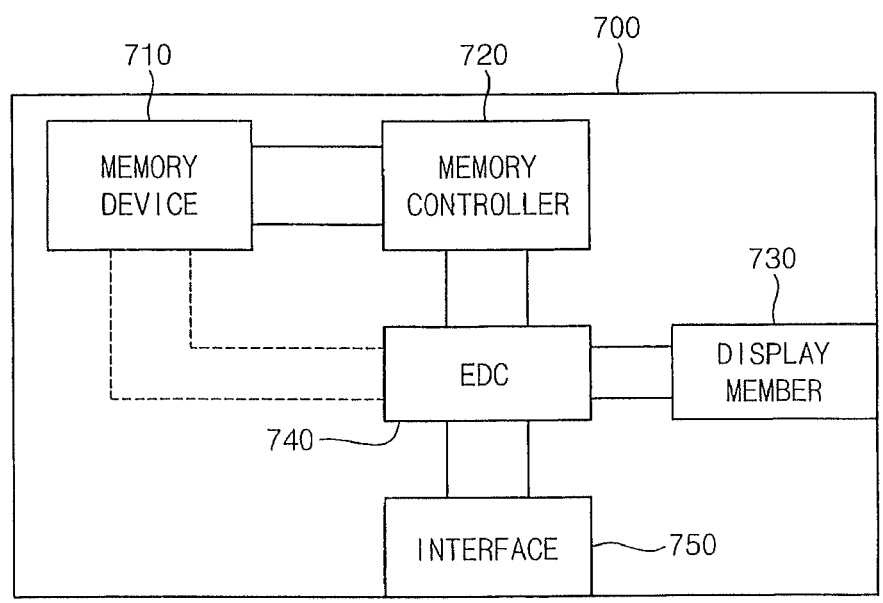
FIG. 23 is a block diagram illustrating still another memory system in accordance with example embodiments.

FIG. 23 is a block diagram illustrating another memory system in accordance with example embodiments.

Referring to FIG. 23, the memory system is used in a portable electronic apparatus 700. The portable electronic apparatus 700 may include an MP3 player, a portable video player, a portable multimedia player, a digital camera, etc. The memory system in the portable electronic apparatus 700 includes a memory device 710 and a memory controller 720. Further, the memory system includes an encoder/decoder (EDC) 740, a display member 730 and an interface 750. The memory device 710 may include at least one electrode structure having at least one diffusion barrier layer as described above.

The EDC 740 may input/output data such as audio data or video data into/from the memory device 710 through the memory controller 720. Alternatively, the data may be directly inputted from the EDC 740 into the memory device 710 or may be directly outputted from the memory device 710 into the EDC 740. The EDC 740 may encode of the data stored in the memory device 710. For example, the EDS 740 may carry out encoding of MP3 files to store the audio data into the memory device 710. Alternatively, the EDC 740 may encode MPEG files to store the video data into the memory device 710. Further, the EDS 740 may include a compound encoder for encoding different file types of various data. For example, the EDC 740 may include an MP3 encoder for the audio data and an MPEG encoder for the video data.

The EDC 740 may decord the data from the memory device 710. For example, the EDC 740 may perform decoding of the MP3 files based on the audio data stored in the memory device 710. Alternatively, the EDC 740 may execute decoding of MPEG files from the video data stored in the memory device 710. Hence, the EDC 740 may include an MP3 decoder for the audio data and an MPEG decoder for the video data.

In example embodiments, the EDC 740 may include a decoder without an encoder. For example, encoded data may be inputted into the EDC 740, and then the encoded data may be directly stored into the memory device 710 or may be stored into the memory device 710 through the memory controller 720 when the EDC 740 has the decoder only.

In some example embodiments, the EDC 740 may receive data for encording or encoded data through the interface 750. The interface 750 may meet a predetermined reference such as a fire wire or a USB. For example, the interface 750 may include a fire wire interface or a USB interface. Further, the data stored in the memory device 710 may be outputted through the interface 750.

The display member 730 may display the data outputted from the memory device 710 or the decorded data from the EDC 740. For example, the display member 730 may include a speaker jack to output the audio data and/or a display screen to display the video data.

Figure 24:
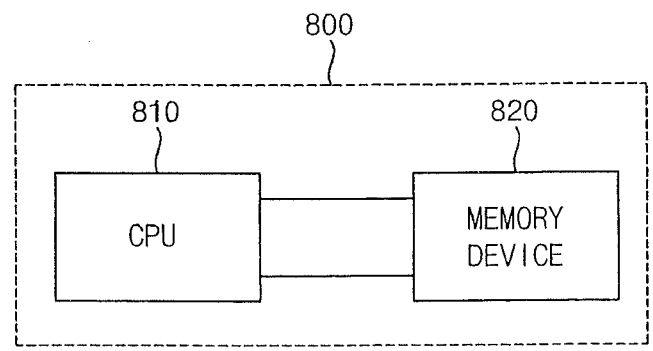
FIG. 24 is a block diagram illustrating still another memory system in accordance with example embodiments

FIG. 24 is a block diagram illustrating still another memory system in accordance with example embodiments.

Referring to FIG. 24, the memory system includes a memory device 820 and a central processing unit (CPU) 810 in a computer system 800. The memory device 820 may be electrically connected to the CPU 810. For example, the computer system 800 may include a personal computer, a personal data assistant, a note book computer, etc. The memory device 820 may be directly connected to the CPU 810 or may be electrically connected to the CPU 810 through a BUS.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A method of manufacturing an electrode structure in a semiconductor device, comprising:
    forming a conductive layer on a substrate;
    forming a mask on the conductive layer;
    forming a preliminary conductive layer pattern on the substrate by partially etching the conductive layer using the mask;
    forming a preliminary diffusion barrier layer on the preliminary conductive layer pattern;
    forming a conductive layer pattern on the substrate by etching the preliminary conductive layer pattern; and
    forming a diffusion barrier layer on a sidewall of the conductive layer pattern by etching the preliminary diffusion barrier layer, wherein the diffusion barrier layer is at least partially recessed relative to a sidewall of the mask and is formed on a sidewall of the conductive layer pattern that is recessed relative to the sidewall of the mask.

2. The method of claim 1, wherein forming the preliminary conductive layer pattern comprises doping impurities into the preliminary conductive layer.

3. The method of claim 1, wherein forming the preliminary conductive layer pattern comprises etching a peripheral portion of the preliminary conductive layer pattern so that a central portion of the preliminary conductive layer pattern is protruded from a peripheral portion of the preliminary conductive layer pattern.

4. The method of claim 3, wherein the preliminary diffusion barrier layer is formed on the peripheral portion and a sidewall of the central portion of the preliminary conductive layer pattern.

5. The method of claim 1, wherein forming a preliminary diffusion barrier layer comprises a nitration treatment process performed about the preliminary conductive layer pattern.

6. The method of claim 5, wherein the nitration process is carried out using a plasma generated from a gas including nitrogen.

7. The method of claim 6, wherein the gas includes at least one selected from the group consisting of a nitrogen ($N_2$) gas, a nitric oxide (NO) gas, a nitrogen dioxide ($NO_2$) gas, a dinitrogen monoxide ($N_2O$) gas and an ammonia ($NH_3$) gas.

8. The method of claim 5, wherein the nitration process is executed using a power of about 0.5 kW to about 10 kW so that the preliminary diffusion barrier layer has a thickness of about 5Å to about 30Å.

9. The method of claim 1, wherein forming the preliminary conductive layer pattern and forming the preliminary diffusion barrier layer are performed in-situ or ex-situ.

10. The method of claim 1, further comprising:
    forming a metal-containing layer on the conductive layer before forming the mask; and
    forming a metal-containing layer pattern on the preliminary conductive layer pattern by partially etching the metal-containing layer using the mask.

11. The method of claim 10, wherein forming the metal-containing layer comprises:
    forming at least one metal compound layer on the conductive layer; and
    forming a metal layer on the metal compound layer.

12. The method of claim 10, further comprising forming an additional diffusion barrier layer on a sidewall of the metal-containing layer pattern.

* * * * *